United States Patent [19]

Renn et al.

[11] Patent Number: 5,452,183
[45] Date of Patent: Sep. 19, 1995

[54] CHIP CARRIER SYSTEM

[75] Inventors: Robert M. Renn, Pfafftown; Keith L. Volz, Jamestown; Robert D. Irlbeck, Greensboro; Frederick R. Deak, Kernersville, all of N.C.

[73] Assignee: The Whitaker Corporation, Wilmington, Del.

[21] Appl. No.: 218,550

[22] Filed: Mar. 28, 1994

[51] Int. Cl.⁶ ............................................. H01R 9/09
[52] U.S. Cl. .................... 361/789; 361/776; 361/785; 361/807; 361/813; 174/255; 257/690; 439/66; 439/74
[58] Field of Search ............... 361/748, 761, 772, 773, 361/774, 776, 785, 789, 792, 802, 807, 809, 810, 813, ; 174/52.4, 255, 261; 439/66, 74, 91; 257/690, 692

[56] References Cited

U.S. PATENT DOCUMENTS

| | | | |
|---|---|---|---|
| 4,618,739 | 10/1986 | Theobald | 174/52 FP |
| 5,167,326 | 12/1992 | Murphy | 206/331 |
| 5,232,372 | 8/1993 | Bradley et al. | 439/66 |

Primary Examiner—Leo Picard
Assistant Examiner—Young Whang
Attorney, Agent, or Firm—Bill Noll

[57] ABSTRACT

This invention is directed to a chip carrier system for mounting to a first planar electronic device, such as a motherboard or test fixture, where first planar electronic device is provided with a planar, electrical interconnection interface mounted thereto. The chip carrier system includes a frame comprising a peripheral body portion defined by upper and lower planar surfaces, a recess in the lower planar surface to receive the planar, electrical interconnection interface, a central recess terminating in a floor to receive a second planar electronic device, such as an integrated circuit chip, having leads extending therefrom, converging side walls extending from the upper planar surface down to the floor, and plural through slots for receiving the leads. Cooperating therewith is a force applying member adapted to provide a normal force to the second planar electronic device and be mechanically secured to the frame. The force applying member includes plural ribs arranged to overlie portions of the converging side walls, whereby as the force applying member is brought into engagement with the frame, the ribs, in contact with the converging side walls, are cammed inwardly into contact with the leads of the second planar electronic device to apply a normal force thereto in contact with a resilient electrical connector associated with the planar, electrical interconnection interface.

10 Claims, 8 Drawing Sheets

Fig. 9

CHIP CARRIER SYSTEM

BACKGROUND OF THE INVENTION

This invention relates to a chip carrier system for the receipt of an integrated circuit "chip", where such chip, as known in the art, typically comprises a planar electronic device, having plural leads extending from the periphery thereof for electrical interconnection to a second planar electronic device, such as a motherboard.

There are many applications for chip carrier or socket systems to electrical interconnect one electronic device to another. One such system is a burn-in test socket, where a manufacturer of chips will subject same to an elevated temperature, while at the same time, electrically powering the chips. By way of example, a bath of chips is electrically powered in an oven where the temperature is maintained at approximately 150° C. for an extended period of time, such as 1,000 hours. This is referred to in the art as "burn-in". For additional information on burn-in testing, and a socket system for accomplishing same, reference is made to copending application, U.S. Ser. No. 08/081,769, filed Jun. 23, 1993, and assigned to the assignee hereof.

The chip after testing, must be suitably transferred to an equipment manufacturer where it may be installed in an end user socket in a system for consumer use. One of the major problems is this transferral process lies in the rather delicate nature of the chips, more precisely the chip leads. Such leads are formed, exposed metal members arranged in arrays along the chip periphery on small center-lines, on the order of about 0.016 inches. A chip, even after a successful burn-in test, may not be suitable for electrical interconnection to a second device due to damage to the leads.

The present invention offers a unique chip carrier system that may be used to effectively protect a chip during testing, transport, and end use. Additionally, by the use of a unique force applying member, in cooperation with a chip receiving frame member, an effective uniform normal force is exerted on the chip leads against a resilient electrical interconnection means within the chip carrier mounted to a planar electronic device, such as a motherboard or test fixture. The features of this invention will become apparent in the description which follows, particularly when read in conjunction with the accompanying drawings.

SUMMARY OF THE INVENTION

This invention relates to an integrated circuit chip carrier system that provides protection to the delicate leads of the chip during testing, transport and end use. The system, for mounting to a first planar electronic device, where such device may be a test fixture or a motherboard, includes a planar, electrical interconnection interface mounted thereto. The chip carrier system includes a frame having a peripheral body portion defined by upper and lower planar surfaces, a recess in the lower planar surface to receive the planar, electrical interconnection interface, a central recess terminating in a floor for receiving the chip, where the chip has leads laterally extending therefrom, converging side walls extending from the upper planar surface down to the floor, and plural through slots for receiving the leads. Further, the carrier system includes a applying member, where such member is adapted to provide a normal force to the chip leads and be mechanically secured to the frame. The force applying member includes plural ribs arranged to overlie portions for the converging side walls, whereby as the force applying member is brought into engagement with the frame, the ribs, in contact with the converging side walls, are cammed inwardly into contact with the leads of the chip to apply a normal force thereto in contact with a resilient electrical connector means associated with the planar, electrical interconnection interface.

DETAILED DESCRIPTION OF PREFERRED EMBODIMENTS

Figure 1:
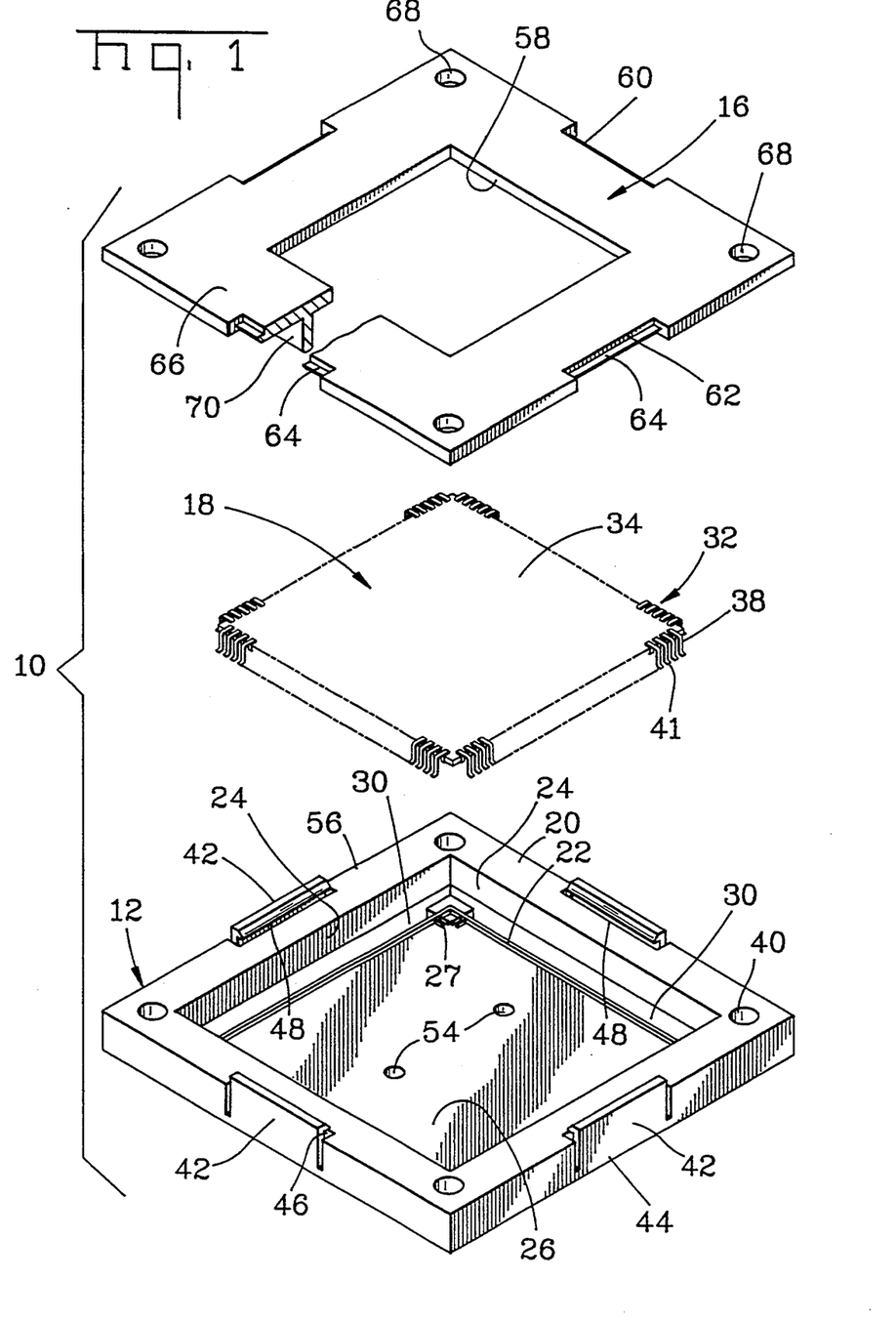
FIG. 1 is an exploded perspective view of the chip carrier system according to the invention, where the chip has been illustrated with only selected leads, rather than the normal continuous array of leads.
Figure 2:
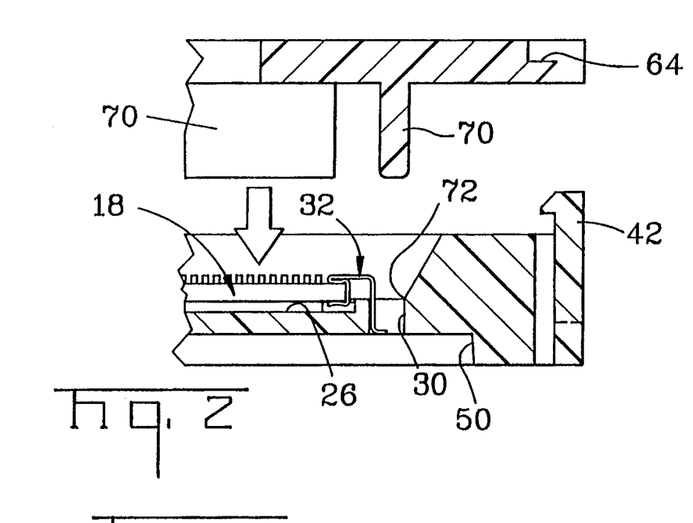
FIGS. 2 to 5 are partially sectioned views illustrating the sequence of engaging the force applying member to the frame of the chip carrier system to laterally secure and wipe the chip leads within the frame.
Figure 3:
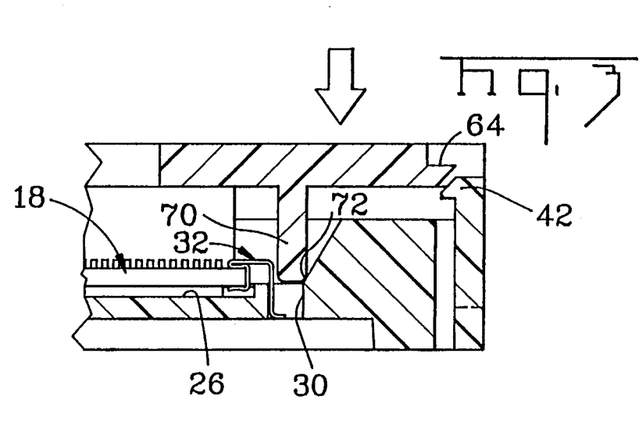
Figure 4:
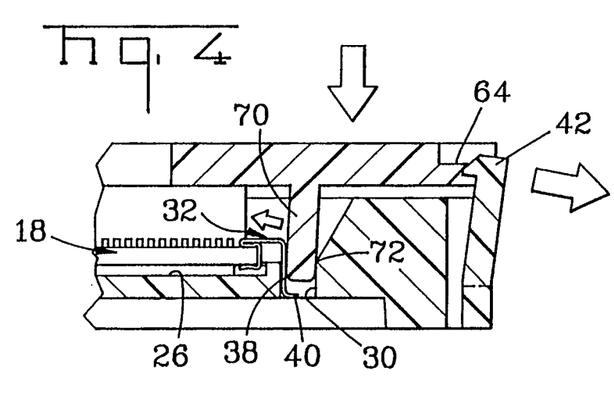

The invention hereof relates to a chip carrier system for the receipt of an integrated circuit "chip". The chip carrier system 10, as shown in FIG. 1 comprises an essentially rectangular frame 12 for mounting to a planar electronic device 14, such as a test fixture or motherboard (see FIG. 6), and a force applying member 16, which, as explained hereinafter, is intended to apply a normal and lateral force to the leads of a contained chip 18 seated within the frame of the chip carrier system.

The frame 12, molded of a dielectric material, such as plastic, consists of a peripheral wall 20, a central recess 22 having converging side walls 24 leading to a floor 26, where the floor may include alignment ribs 27 for the precise positioning of the chip 18. At the base of the converging side walls 24, plural through slots 30 are provided to receive the leads 32 of chip 18.

By way of background, the integrated circuit chip 18, as known in the art, typically comprises a rectangular body 34 having a preselected circuit pattern thereon, and a plurality of leads 32 extending from the body 34. The leads 32 are L-shaped having a first leg 38 with an end or contact portion 40 formed at a right angle to first leg 38, where said leads, by virtue of their contact with the electrical interconnection means, as hereinafter explained, support the chip within the assembly. Continuing with a description of the frame, the frame 12, about the peripheral wall 20, is provided with plural through holes 40, each hole receiving a threaded fastener, as known in the art, for mounting the chip carrier system 10 to a planar electronic device 14. Additionally, along the outer edge of the peripheral walls 20, there are provided a plurality of integrally molded latching arms 42. The arms are integrally molded at the base 44 to the frame, with a spacing 46 about the upper portion thereof so the arm 42 may flex away from the body of the wall. Projecting inwardly from each arm is a latching shoulder 48, where the function thereof will be more apparent in the discussion which follows on the assembly sequence of FIGS. 2 to 5.

Figure 7:
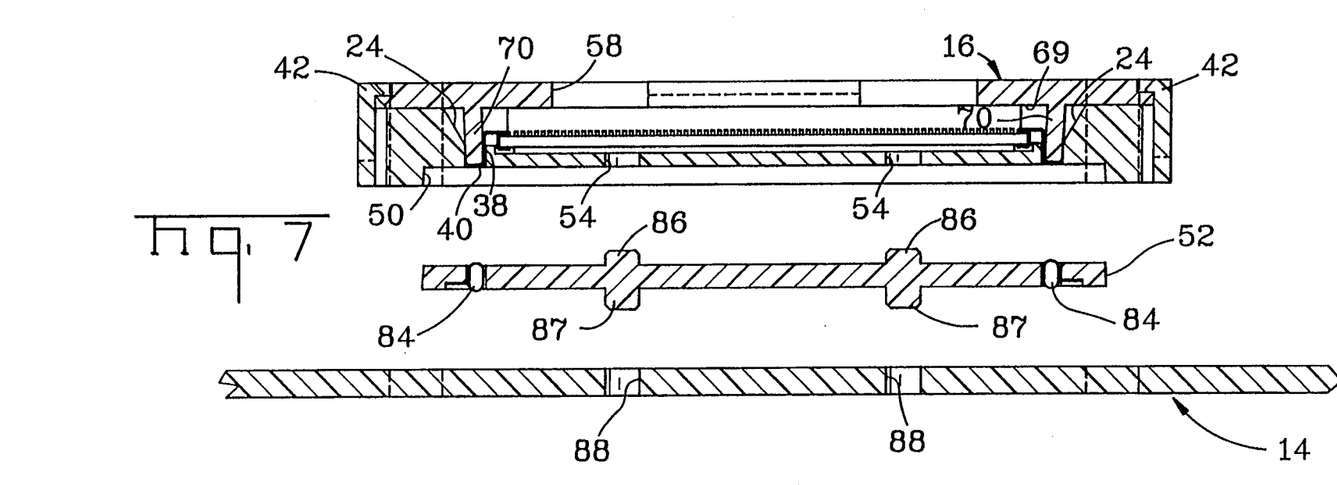
FIG. 7 is a sectional view of the assembly illustrated in FIG. 6.
Figure 8:
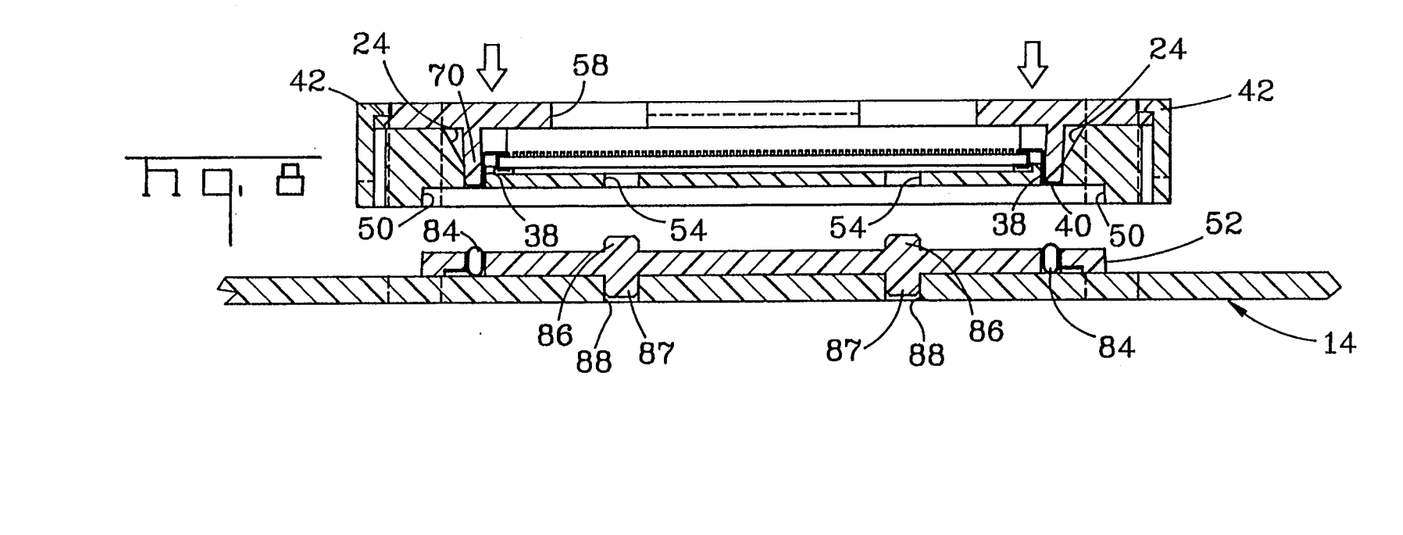
FIG. 8 is a sectional view of the assembled chip system of FIG. 1, positioned for mounting to the underlying planar electronic device.

Before considering such assembly sequence, it will be noted that the underside of the frame floor 26 (FIGS. 2 to 5) has been provided with a broad recess 50, which as explained later, is configured to fully receive the electrical interconnection interface 52, the function of which is to electrically interconnect the chip 18 to an underlying planar electronic device 14, see FIG. 6. To facilitate such receipt, the walls of the recess is tapered to receive the correspondingly angled walls of the interface 52. Further, with regard to the floor 26, plural through holes 54 may be provided to receive corresponding projections from the interface 52 to ensure alignment therebetween (FIGS. 7-8).

The force applying member 16, molded of a dielectric material, such as plastic, is essentially a planar member adapted to overlie the contained chip 18 and seat on a frame surface 56. The force applying member 16 may include a central opening 58. Further, about the periphery of the member, plural recesses 60 are included, where the position or location thereof are aligned with the respective latching arms 42. Each such recess, along the inner wall 62 thereof, includes a shoulder 64 recessed from the upper surface 66 of the member 16. At the respective corners thereof, through holes 68, aligned with the respective holes 40 of the frame, are provided for mounting the chip carrier system 10 to the underlying planar electronic device 14.

Finally, projecting from the lower surface 69, as seen in FIG. 1, are plural ribs 70, where the length thereof is essentially coextensive with the array of chip leads 32. Further, such ribs 70 are arranged about the member 16 so that in a preassembled position the ribs will overlie a portion of the converging side walls 24. The ribs, though formed of a relatively rigid plastic, will flex when a lateral force is applied at the end thereof.

Figure 5:
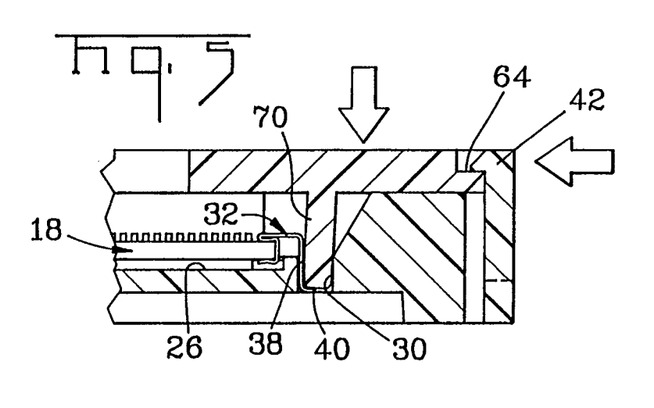

FIGS. 2 to 5, respectively, represent the steps of assembly of the chip carrier system of this invention. In the figures it will be noted that the chip 18 has been seated on the frame floor 26, and that the chip leads 32 reside within the respective slots 30 for eventual contact with interconnection means, as hereinafter explained. To assemble the chip carrier system, the force applying member 16 is directed toward the frame 12 (FIG. 2), then in contact therewith (FIG. 3) the ribs 70 rest against the converging walls 24 near the junction 72 of the wall 24 and slot 30. As the force applying member 16 continues toward the frame 12, the converging walls 24 cam the ribs 70 toward and into the slots 30 (FIG. 4), note the small direction arrow. As the rib enters the slot 30, the end of the rib applies a lateral force to the chip lead, specifically the first leg 38, while wiping the lead. Concurrent with this action, the respective latching arms 42 coact with the shoulders 64 to flex said arms outwardly until the latching arms 42 may override the shoulders 64 and resile into lacking engagement therewith (FIG. 5). FIG. 7 illustrates a full sectional view of the assembled chip carrier system of this invention; note that the ribs 70 remain flexed inwardly against the lead leg 38 applying a sustained lateral force thereagainst.

In a typical chip socket, such as the type disclosed in said co-pending application, the electrical interconnection means is an integral part of the socket assembly. The present invention differs in that regard by the provision of an interchangeable or removable interconnection means that is independent of the chip carrier system. For example, an electrical interconnection means of the type to be described hereinafter may be mounted to a planar test fixture, while a second comparable electrical interconnection means may be mounted on a motherboard, where a successfully tested chip is safely transported from one interconnection means to another. This can best be understood in the description which follows.

Figure 6:
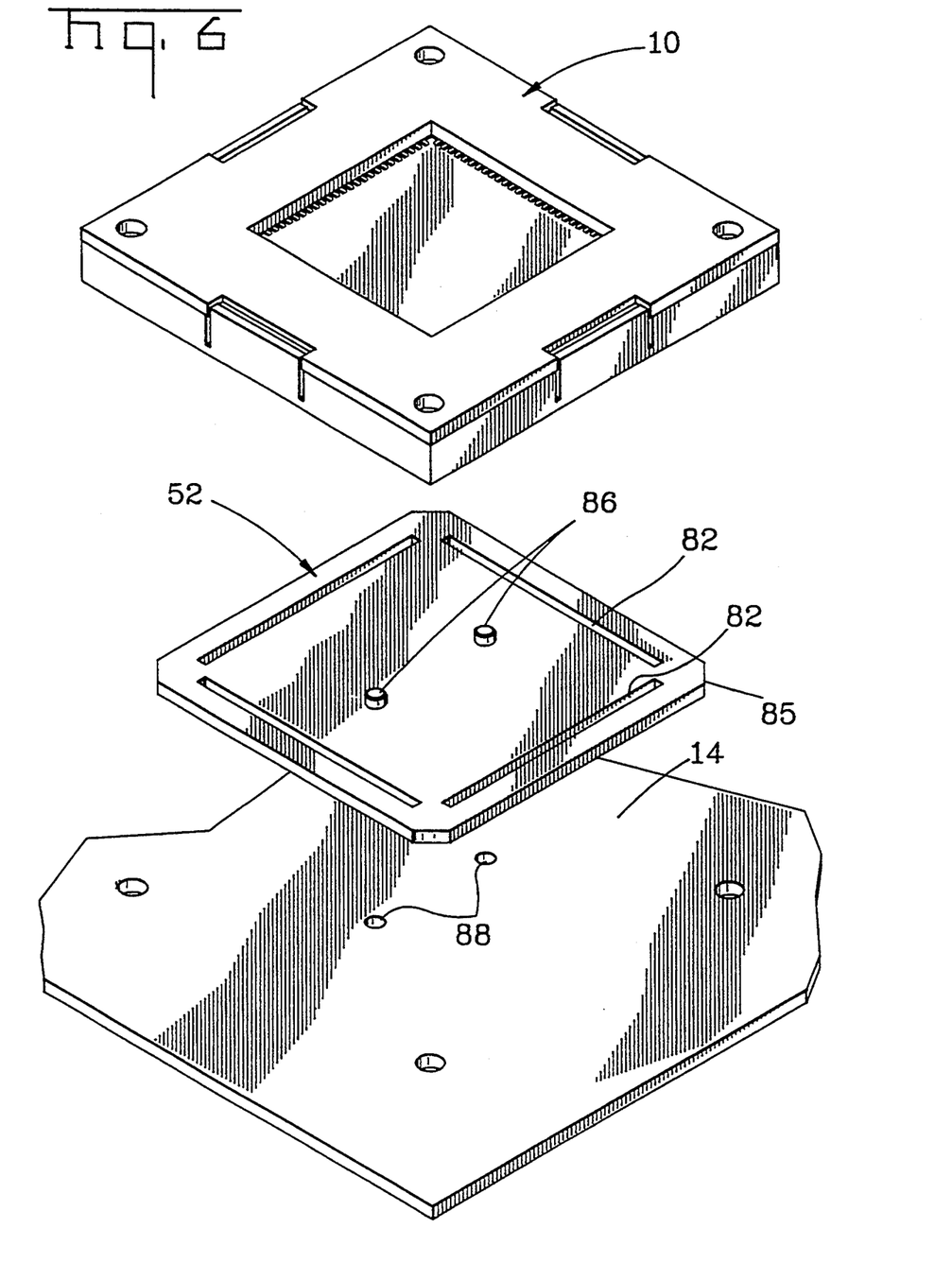
FIG. 6 is an exploded perspective view of the chip carrier system positioned for mounting to a planar electronic device, such as a test fixture or motherboard, with a electrical interconnection interface means mounted therebetween.

FIG. 6 shows a latched chip carrier 10 positioned over an electrical interconnection interface 52 which in turn is positioned for mounting to the planar electronic device 14. The interconnection interface 52 comprises a planar member, preferably including plural slots 82, aligned with slots 30 in the frame floor 26, for the receipt of a resilient electrical interconnection means 84, such as an elastomeric connector (FIGS. 7-8). An elastomeric connector of the type contemplated for use herein, is a commercial product sold by AMP Incorporated, Harrisburg, Pa., under the registered trademark owned by The Whitaker Corporation, Wilmington, Del. These connectors, intended for surface mount interconnection systems, consist of a thin flexible polyimide film, having etched electrical circuitry thereon, wrapped around a soft, non-conducting core, such as silicone, where the core is formulated to resist permanent set under long term compression.

Additionally, the interconnection interface 52 may be provided with at least a pair of alignment posts 86, 87 extending from the respective upper and lower surfaces of the planar member. Complementary holes 54,88 are provided in the frame floor 26 and planar electronic device 14, respectively, to ensure mating and alignment of the interconnection interface 52. In operation, the interconnection interface lies contiguous with the planar electronic device 14, and is retained thereon by the posts 87 seated in holes 88. Thereafter, the chip carrier system, with the chip mounted therein, is mounted to the electronic device 14 to overlie the interconnection interface positioned thereon. As noted previously, the interconnection interface 52 is configured to nestle or seat within the recess 50 about the bottom of the frame body. In the embodiment illustrated in FIGS. 6–8, the interconnection interface is shown with chamfered corners 85 so as to fit within the area defined by holes 68 and not interfere therewith.

Note particularly from the illustration of FIG. 8, by the use of a resilient interconnection means 84 which projects above the upper planar surface of the interface 52, the force applying member 16 can exert a uniform, normal force against the chip leads ends 40 in contact therewith.

Figure 9:
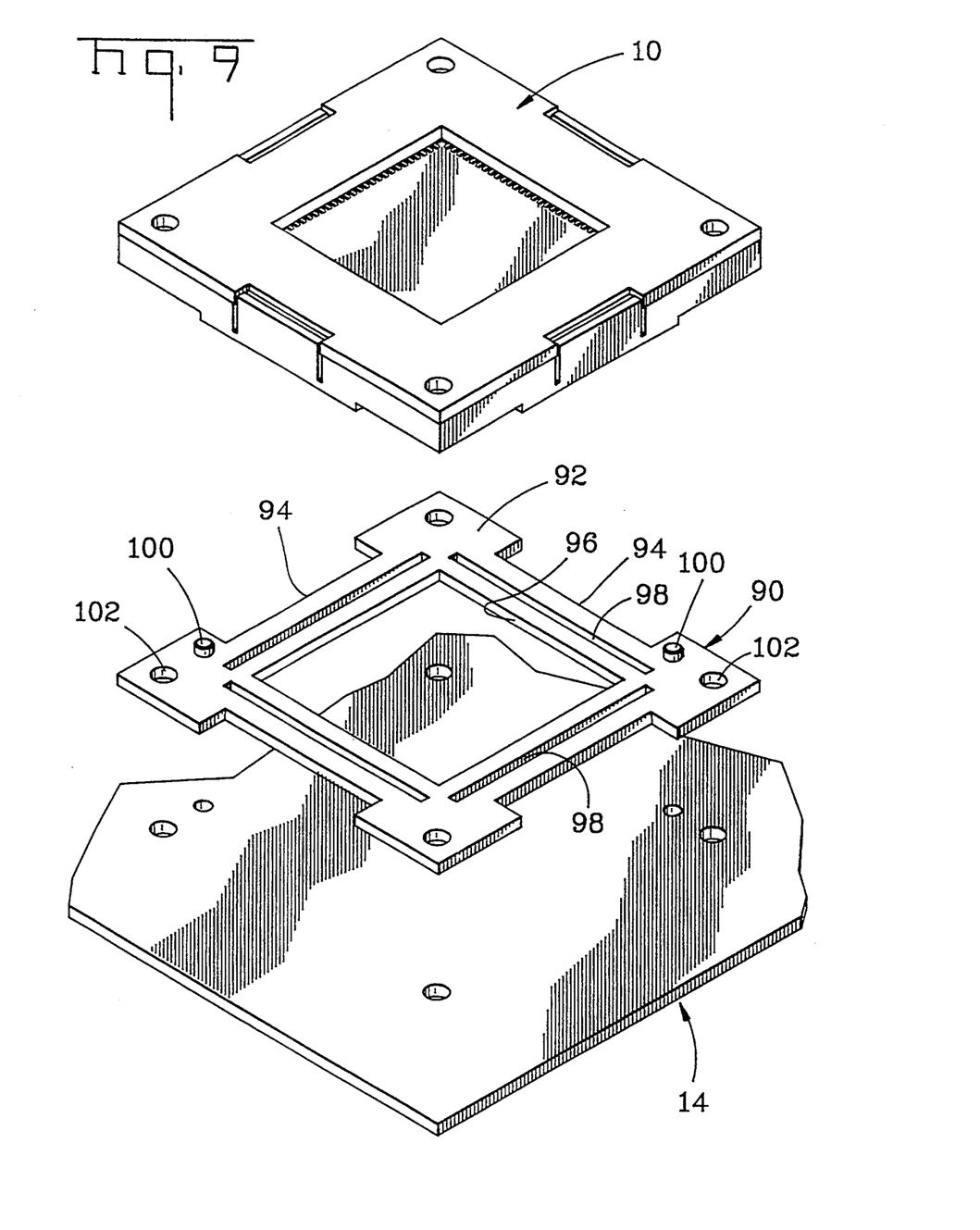
FIG. 9 is an exploded perspective view similar to FIG. 6, showing an alternate embodiment to the electrical interconnection interface means.
Figure 10:
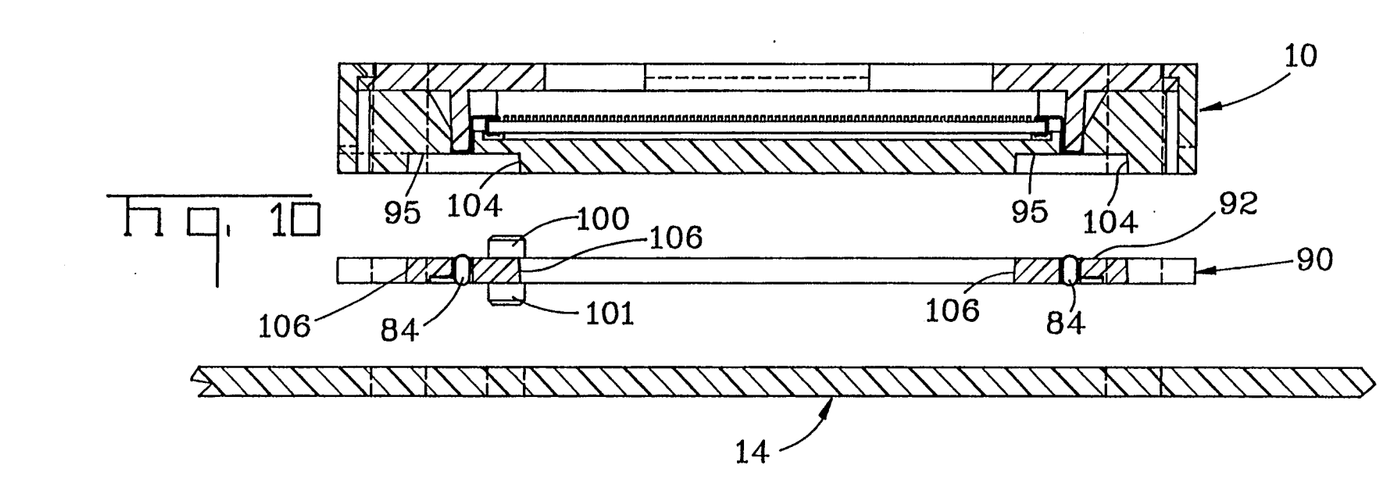
FIGS. 10 and 11 are sectional views similar to FIGS. 7 and 8, respectively, showing the alternate embodiment of FIG. 9.
Figure 11:
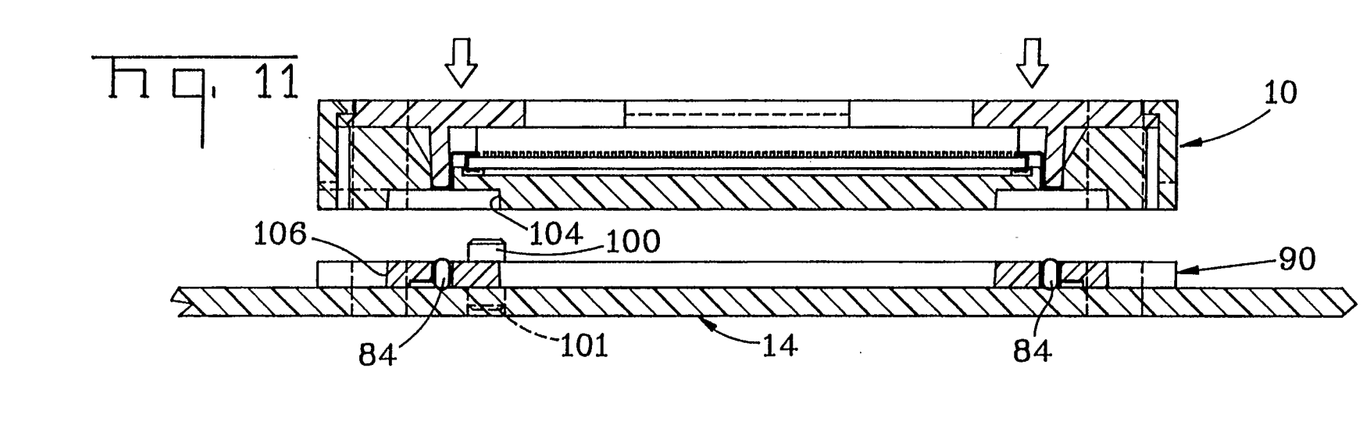

FIG. 9, similar to FIG. 6, illustrates an alternate embodiment for the electrical interconnection interface 90. Such interface 90 comprises a planar member 92 that is essentially coextensive with the chip carrier 10, except that recesses 94 have been provided along the respective sides. Additionally, a central opening 96 has been provided. The floor of the chip carrier 10, as with the embodiment of FIGS. 1-8, has been contoured or recessed to fully receive the planar member 92. Within the member 92, plural slots 98 are provided to receive corresponding resilient elastomeric connector, such as an AMPLIFLEX connector, as described above. Further, alignment posts 100, 101 aligned with and for receipt in corresponding slots in the respective members to be engaged therewith, are provided. Finally, this planar member 92 includes corner through holes 102, where such holes are aligned with the mounting through holes in the chip carrier 10 and planar electronic device 14, to facilitate mounting the members together. In FIGS. 10 and 11, it will be noted that the walls 104 of the recesses 95 have been tapered to correspond to the angled side walls 106 of the planar member 92 to ensure an engagement of parts without an interference or press fit.

Figure 12:
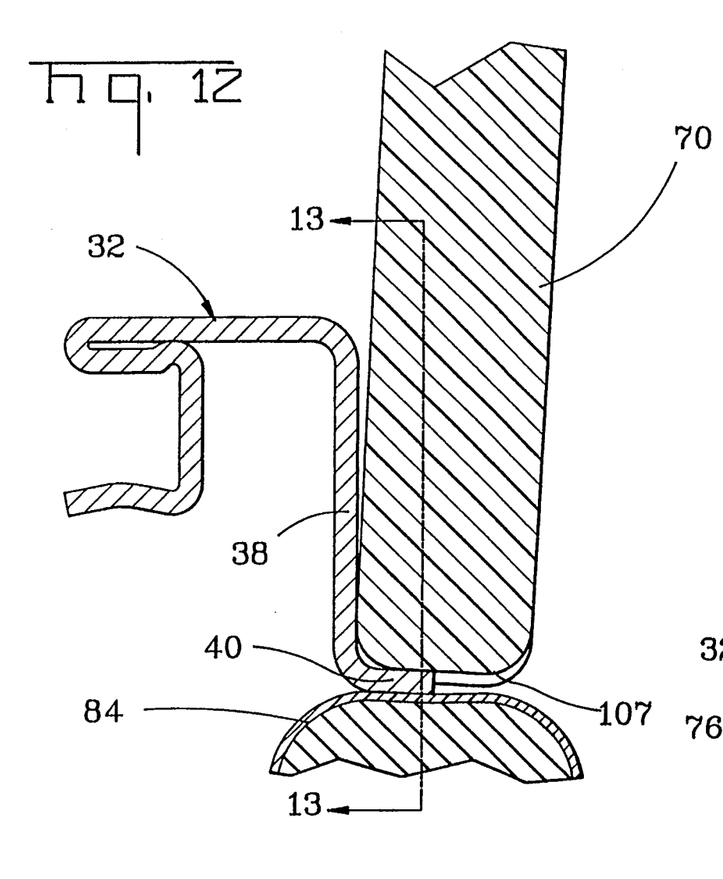
FIG. 12 is a partial, but enlarged sectional view taken through a rib of the force applying member, and the electrical chip leads to be captured thereby.
Figure 13:
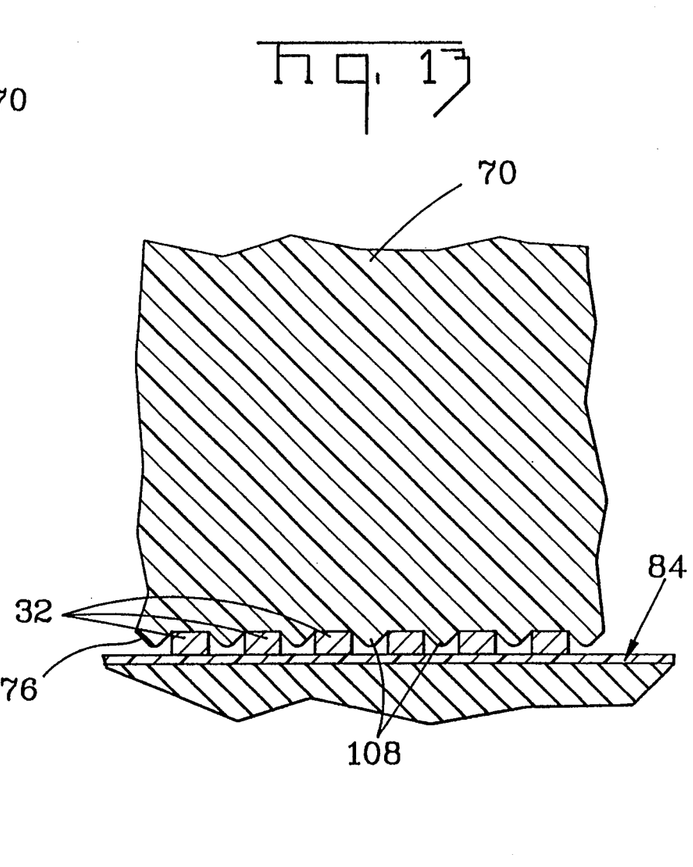
FIG. 13 is a sectional view taken along line 13—13 of FIG. 12.

One of the major difficulties in handling and transporting the integrated circuit chips, particularly with the delicate leads 32 extending therefrom, where such leads are plated metal wires of a small, typically rectangular cross section, on centerlines of 0.016 inches, is damage and bending of the leads. FIGS. 12 and 13 represent an approach by which the lower surfaces 107 of the ribs 70 are profiled to include plural, lateral peaks and valleys 108 to capture, align and secure the lead contact portions 40, see FIG. 13.

Figure 14:
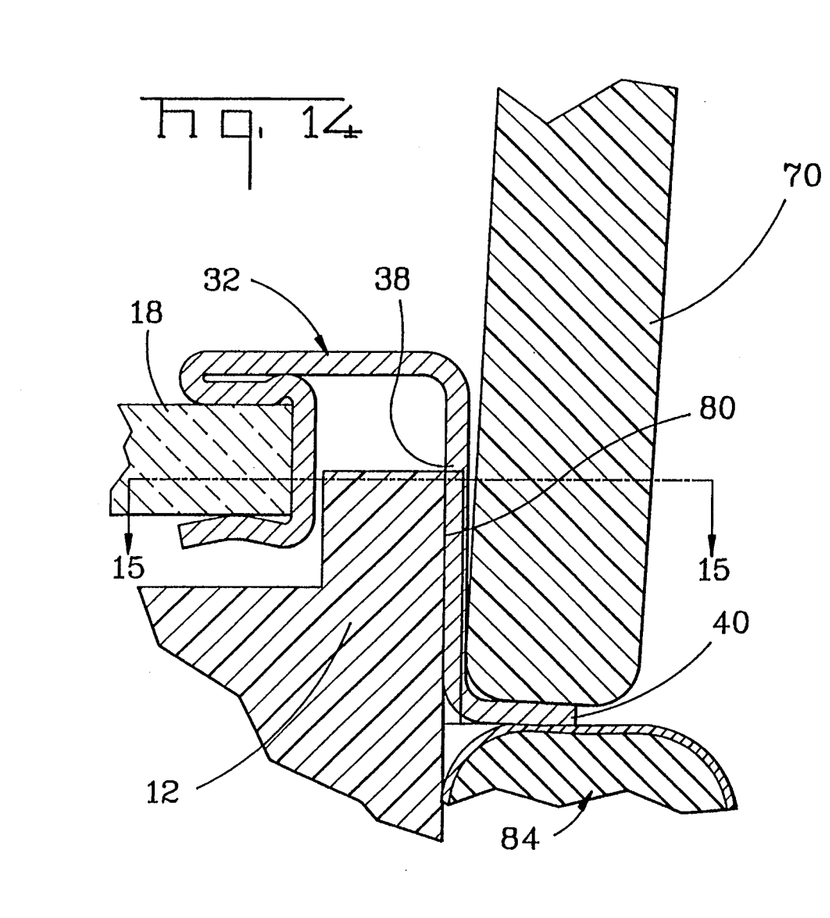
FIG. 14 is a partial, but enlarged sectional view, similar to FIG. 12, showing an alternate approach to the use of plural ribs for isolating and aligning the respective leads of the chip.
Figure 15:
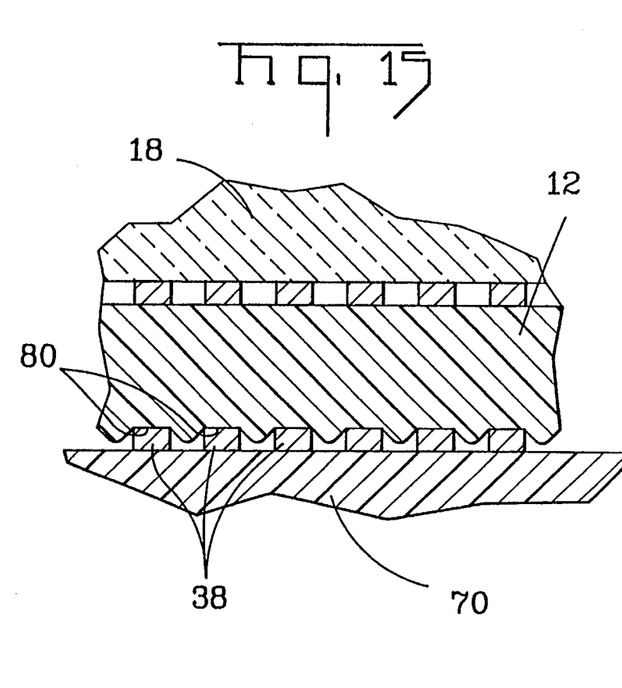
FIG. 15 is a sectional view taken along line 15—15 of FIG. 14.

FIGS. 14 and 15 represent an alternative approach to the lead separation/alignment means of FIGS. 12 and 13. In the embodiment of FIGS. 14 and 15, the wall 80 of the slot 30 has been provided with plural grooves 80, where such grooves are defined by plural alternating peaks and valleys on centerlines comparable to the lead centerlines. Though not illustrated, grooves or separators may be included in the base of the slot. Thus, by these arrangements, a lead 38 is caused to settle or seat within a respective groove 80 where it properly aligns with an appropriate circuit trace on the underlying elastomeric connector 84. By the systems of the respective embodiments in FIG. 12 to 15, it will be seen that an effective means has been provided to separate, align and protect the delicate chip lead portions 38.

We claim:

1. A chip carrier system for mounting to a first planar electronic device, where said first planar electronic device includes a planar, electrical interconnection interface mounted thereto, said chip carrier system including, a frame comprising a peripheral body portion defined by upper and lower planar surfaces, a recess in the lower planar surface to receive said planar, electrical interconnection interface, a central recess terminating in a floor for receiving a second planar electronic device having leads extending therefrom, converging side walls extending from said upper planar surface down to said floor, and plural through slots for receiving said leads, and a force applying member adapted to provide a normal force to said second planar electronic device and be mechanically secured to said frame, said force applying member including plural ribs arranged to overlie portions of said converging side walls, whereby as said force applying member is brought into engagement with said frame, said ribs, in contact with said converging side walls, are cammed inwardly into contact with the leads of second planar electronic device to apply a normal force thereto in contact with a resilient electrical connector means associated with said planar, electrical interconnection interface.

2. The chip carrier system according to claim 1, wherein said leads consist of a first leg adjacent to a wall of said slot, and a second leg perpendicular thereto in contact with said resilient electrical connector means, and that in the assembled and secured position said ribs apply a lateral force to said first legs and a normal force to said second legs.

3. The chip carrier system according to claim 1, wherein said ribs include a pattern of transverse peaks and valleys whereby to separate and capture said leads during application of said force applying member.

4. The chip carrier system according to claim 3, wherein said second planar electronic device includes a rectangular body portion with leads extending from the periphery of said body portion, and the length of a given said rib is essentially co-extensive with a respective said of said body portion.

5. The chip carrier system according to claim 4, wherein as said force applying member is brought into full engagement with said frame, said ribs effect wiping of the respective said first legs.

6. The chip carrier system according to claim 4, wherein the body portion of said second planar device is spaced from said frame floor, and that said body portion is supported within the system by said leads in contact with said resilient electrical interconnection means.

7. The chip carrier system according to claim 1, wherein each said through slot includes a side wall characterized by plural, alternating peaks and valleys, where a given said lead is captured within a corresponding said valley to effectively align said leads to complementary leads or traces on said resilient electrical connector means.

8. The chip carrier system according to claim 1, wherein said planar, electrical interconnection interface includes alignment means to respectively align same to said first planar electronic device and said frame.

9. The chip carrier system according to claim 8, wherein said planar, electrical interconnection interface includes plural through slots for receiving said resilient electrical connector means, where said interface slots are aligned with respective slots in said body portion.

10. The chip carrier system according to claim 9, wherein said resilient electrical connector means comprises a thin flexible dielectric film, having etched electrical circuitry thereon, wrapped around an elastomeric core.

* * * * *